US009824905B2

(12) United States Patent
Shibuya et al.

(10) Patent No.: US 9,824,905 B2
(45) Date of Patent: Nov. 21, 2017

(54) SEMICONDUCTOR MANUFACTURING DEVICE AND SEMICONDUCTOR MANUFACTURING METHOD

(71) Applicant: Toshiba Memory Corporation, Minato-ku (JP)

(72) Inventors: Katsunori Shibuya, Mie (JP); Takashi Imoto, Kamakura (JP); Soichi Homma, Yokkaichi (JP); Takeshi Watanabe, Yokkaichi (JP); Yuusuke Takano, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 479 days.

(21) Appl. No.: 14/482,489

(22) Filed: Sep. 10, 2014

(65) Prior Publication Data

US 2015/0167157 A1   Jun. 18, 2015

(30) Foreign Application Priority Data

Dec. 13, 2013   (JP) .................................. 2013-257774

(51) Int. Cl.
*G01R 31/10* (2006.01)
*H01L 21/67* (2006.01)
(Continued)

(52) U.S. Cl.
CPC ........ *H01L 21/67265* (2013.01); *C23C 14/54* (2013.01); *C23C 14/56* (2013.01);
(Continued)

(58) Field of Classification Search
CPC ............ G01R 31/2886; G01R 31/2887; G01R 31/2891; G01R 1/001; G01R 1/18;
(Continued)

(56) References Cited

U.S. PATENT DOCUMENTS 5,742,168 A * 4/1998 Kiyokawa .......... G01R 1/06705
                                                                324/750.13
5,812,409 A * 9/1998 Kanno ............... H05K 13/0413
                                                                324/750.23
(Continued)

FOREIGN PATENT DOCUMENTS

JP       2009-290217 A      12/2009
JP       2010-10396         1/2010
(Continued)

OTHER PUBLICATIONS

Combined Office Action and Search Report dated Oct. 23, 2015 in Taiwanese Patent Application No. 103123684 (with English language translation and English translation of Category of Cited Documents).

(Continued)

*Primary Examiner* — Thang Le
(74) *Attorney, Agent, or Firm* — Oblon, McClelland, Maier & Neustadt, L.L.P.

(57) ABSTRACT

A semiconductor manufacturing device has an upper cover configured to be arranged above top surface of unshielded semiconductor device which are mounted on a tray placed on a carrier to go through electromagnetic shielding, and a displacement detector configured to detect an abnormality when the upper cover is raised by at least one of the semiconductor device which is brought into contact with a bottom surface of the upper cover.

20 Claims, 7 Drawing Sheets

(51) Int. Cl.
*C23C 14/54* (2006.01)
*H01L 23/552* (2006.01)
*C23C 14/56* (2006.01)

(52) U.S. Cl.
CPC .. *H01L 21/67259* (2013.01); *H01L 21/67288* (2013.01); *H01L 23/552* (2013.01); *H01L 2924/0002* (2013.01); *H01L 2924/14* (2013.01)

(58) Field of Classification Search
CPC ............ G01R 1/07342; G01R 1/06705; G01R 1/06794; G01R 1/07314; G01R 29/0835; C23C 14/34; C23C 14/3407; C23C 14/564; C23C 14/50; C23C 14/54; H01L 23/552; H01L 21/67739; H01L 21/67288; H01L 21/67265; H01L 21/4814
USPC .... 324/627, 750.16, 750.19, 750.25, 750.26, 324/750.12, 757.01; 204/192.1, 298.11, 204/298.23
See application file for complete search history.

(56) References Cited

U.S. PATENT DOCUMENTS

| | | | | |
|---|---|---|---|---|
| 6,359,253 | B1 * | 3/2002 | Sritulanont | B23K 26/032 219/121.68 |
| 7,129,726 | B2 * | 10/2006 | Tashiro | G01R 31/2887 324/750.25 |
| 8,277,162 | B2 * | 10/2012 | Na | G01R 31/2893 269/56 |
| 2004/0251460 | A1 * | 12/2004 | Lee | G01R 31/2886 257/48 |
| 2008/0315376 | A1 * | 12/2008 | Tang | H01L 21/568 257/660 |
| 2009/0245982 | A1 * | 10/2009 | Na | G01R 31/2893 414/226.04 |
| 2009/0294930 | A1 | 12/2009 | Yoon et al. | |
| 2010/0147088 | A1 * | 6/2010 | Ito | G01R 31/2893 73/864.81 |
| 2012/0015687 | A1 | 1/2012 | Yamada et al. | |

FOREIGN PATENT DOCUMENTS

| | | |
|---|---|---|
| JP | 2010-238878 | 10/2010 |
| JP | 2012-39104 | 2/2012 |
| TW | 200812890 A | 3/2008 |
| TW | I359102 B | 3/2012 |
| WO | WO2009/060515 A1 | 5/2009 |

OTHER PUBLICATIONS

Combined Chinese Office Action and Search Report dated Feb. 17, 2017 in Chinese Patent Application No. 201410444602.6 (with English translation of categories of cited documents).

* cited by examiner

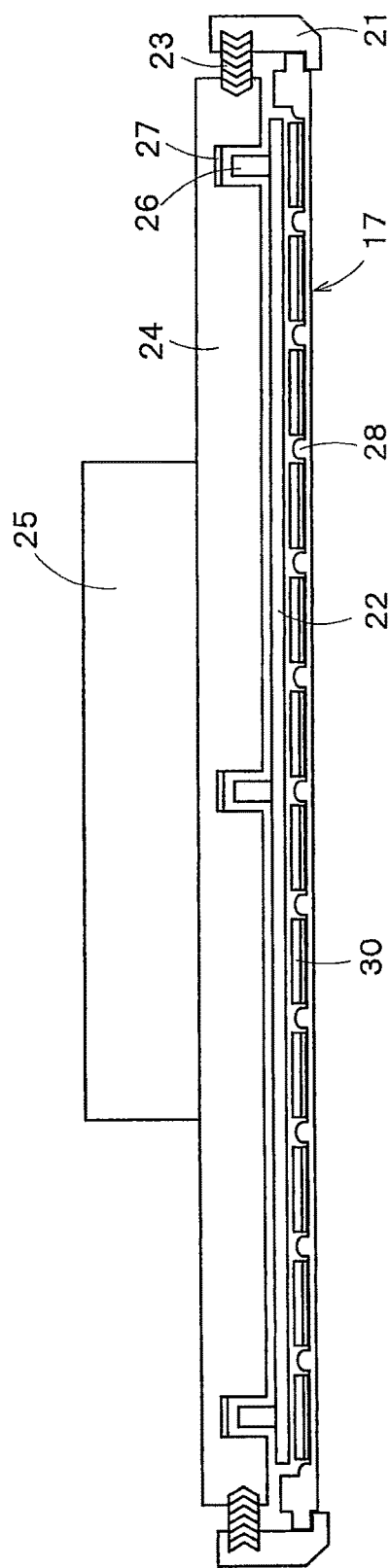
F I G. 4

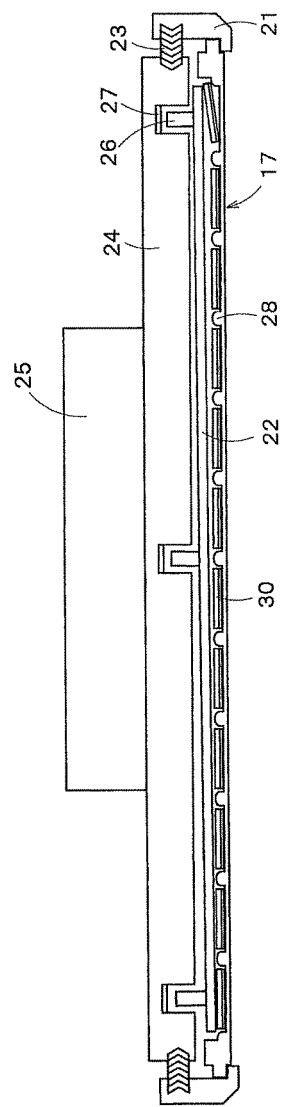
F I G. 5

SEMICONDUCTOR MANUFACTURING DEVICE AND SEMICONDUCTOR MANUFACTURING METHOD

CROSS REFERENCE TO RELATED APPLICATIONS

This application is based upon and claims the benefit of priority from the prior Japanese Patent Application No. 2013-257774, filed on Dec. 13, 2013, the entire contents of which are incorporated herein by reference.

FIELD

Embodiments of the present invention relate to a semiconductor manufacturing device and a semiconductor manufacturing method for electromagnetically shielding a semiconductor package.

BACKGROUND

Semiconductor devices used in a mobile communication tool such as cellular phone, smartphone, etc. are required to restrain unnecessary electromagnetic waves from leaking to the outside as much as possible, not to exert a negative influence on communication properties. Accordingly, a semiconductor package having an electromagnetic shielding function has been proposed.

For example, electromagnetic shielding of the semiconductor package is performed by covering the surface of a package made of resin with a metal film for electromagnetic shielding, to make this metal film electrically contact with the ground layer of a semiconductor chip in the semiconductor package.

The process of covering the surface of resin with a metal film can be performed by using a sputtering device used in a preceding step in the semiconductor manufacturing process. The sputtering device can simultaneously form uniform metal films for a plurality of semiconductor packages. Therefore, work efficiency can be improved if many semiconductor packages which completed a packaging process are placed on a carrier, conveyed to a sputtering device, and taken into a sputtering vacuum chamber together with the carrier to go through sputtering treatment.

Semiconductor packages which has completed the packaging process but have not yet been electromagnetically shielded are kept in a dedicated tray. One tray stores several tens of semiconductor packages, and thus efficiency of the sputtering treatment can be improved if conveying, to the sputtering device, the carrier having the tray thereon with the semiconductor packages being placed on the tray.

The tray has a plurality of recesses for storing the respective semiconductor packages. The size of the recess is designed in conformity with the size of the semiconductor package, and there is little space between the recess and the semiconductor package. Further, in order to coat not only the top surface of the semiconductor package but also all side surfaces of the semiconductor package with the sputtering metal, the height of each wall between adjacent recesses in the tray is set low. Accordingly, when storing the semiconductor package in each recess of the tray or when conveying the tray storing the semiconductor packages, the semiconductor package may possibly go beyond the recess to ride over the wall. In this case, the semiconductor package is housed while being lifted at an angle. If the sputtering treatment is performed on this inclined semiconductor package by the sputtering device, the sputtering metal adheres also to the bottom surface of the semiconductor package, which may cause electrical short circuit between pads on the bottom surface and the sputtering metal.

BRIEF DESCRIPTION OF THE DRAWINGS

FIG. 4 is a diagram showing the positional relationship between an upper cover 22 and tray conveying arms 21 for grasping a tray 17.

FIG. 5 is a diagram showing an example of how to detect an abnormality by displacement sensors.

DETAILED DESCRIPTION

Figure 1:
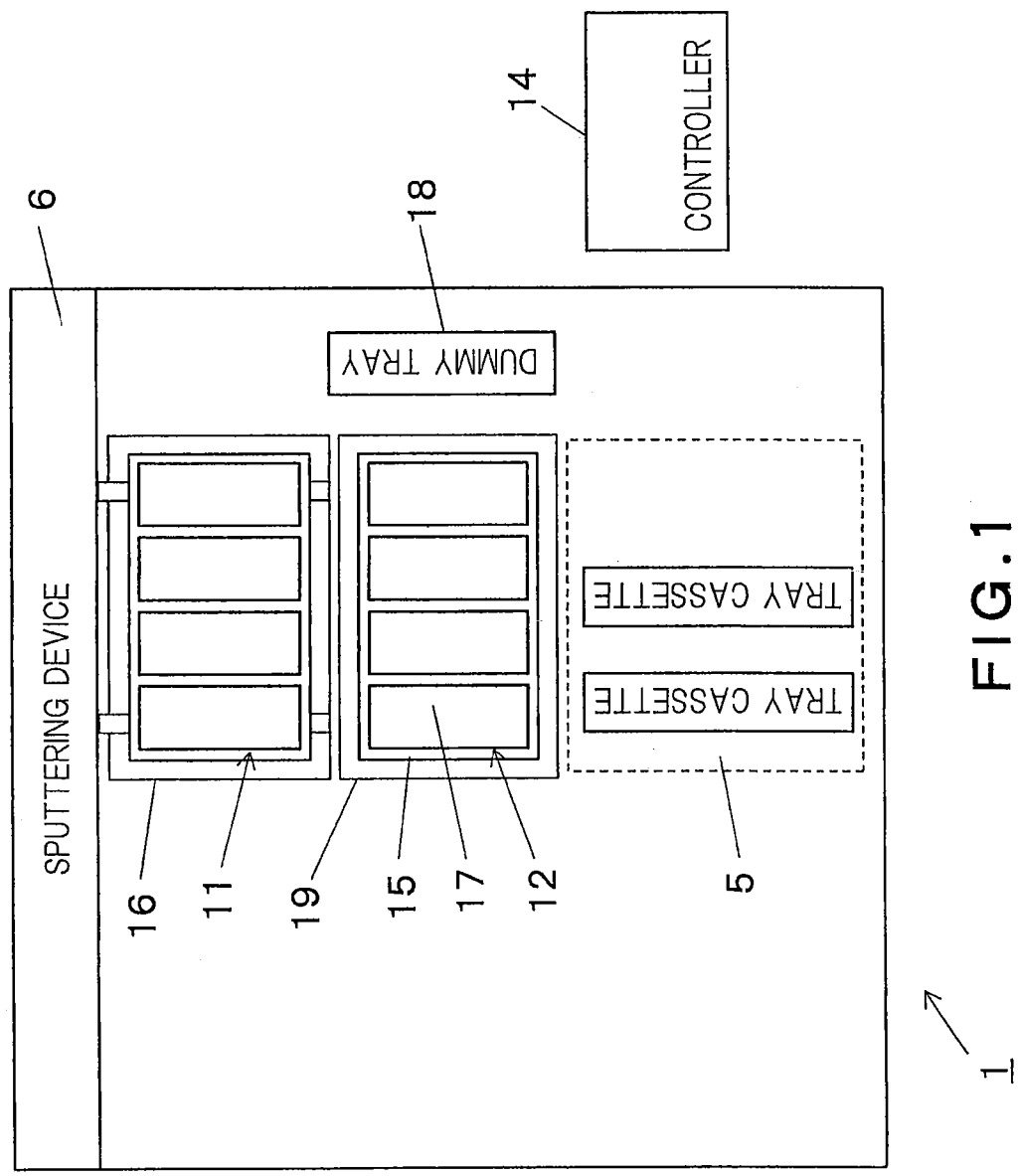
FIG. 1 is a schematic diagram of a semiconductor manufacturing device 1 according to an embodiment.

According to one embodiment, a semiconductor manufacturing device has an upper cover configured to be arranged above top surfaces of unshielded semiconductor device which are mounted on a tray placed on a carrier to go through electromagnetic shielding, and a displacement detector configured to detect an abnormality when the upper cover is raised by at least one of the semiconductor device which is brought into contact with a bottom surface of the upper cover.

Hereinafter, embodiments of the present invention will be explained referring to the drawings. The upper/lower direction in the following embodiments shows a relative direction when the face on which semiconductor chips are provided is defined as the upper side, and thus may be different from the actual upper/lower direction depending on gravitational acceleration.

FIG. 1 is a schematic diagram of a semiconductor manufacturing device 1 according to an embodiment. The semiconductor manufacturing device 1 of FIG. 1 has a first handler 11, a second handler 12, and a controller (conveyance controller) 14.

The second handler 12 takes out a tray 17 from a tray supply storage 5. The first handler 11 passes a carrier 15 having the tray 17 mounted thereon to a sputtering device 6. Further, the first handler 11 places the carrier 15 carried out from the sputtering device 6 on a first conveying table 19 of the second handler 12.

The second handler 12 takes out a tray having unshielded IC packages (semiconductor device) mounted thereon (hereinafter referred to as an unshielded tray) from the tray supply storage 5, and places the tray on the carrier 15. Further, the second handler 12 picks up a tray having shielded IC packages mounted thereon (hereinafter referred to as a shielded tray) from the carrier 15, and stores the tray in the tray supply storage 5.

The tray supply storage 5 stores trays for storing unshielded IC packages (hereinafter referred to as unshielded trays) and trays for storing shielded IC packages (hereinafter referred to as shielded trays), each being stacked vertically. The second handler 12 takes out the vertically stacked unshielded trays 17 one by one, and places each tray on the carrier 15. The second handler 12 keeps the shielded tray 17 mounted on the carrier 15, on the shielded trays vertically stacked in the tray supply storage 5. In the example shown FIG. 1, the tray supply storage 5 has a tray cassette for storing vertically stacked unshielded trays and a tray cassette for storing vertically stacked shielded trays. Note that a plurality of trays 17 may be stacked vertically without using such a tray cassette.

Each of the trays 17 has the same size, and has a plurality of recesses for storing IC packages respectively. A wall which is half the height of the IC packages is provided between adjacent two recesses, in order that the top and side surfaces of all of the IC packages in the tray are coated with the sputtering material when the tray 17 is taken into the sputtering device 6 with the IC packages being mounted thereon.

The controller 14 controls the conveyance of the tray 17 and carrier 15 between the first handler 11 and second handler 12. More concretely, the controller 14 controls the current position of the carrier 15, the number of trays on the carrier 15, the progress of sputtering treatment, etc. The controller 14 can be realized by using a personal computer or a workstation, for example.

In the example of FIG. 1, four trays 17 are placed on the top surface of the carrier 15. The longitudinal length of the tray 17 is nearly the same as the lateral length of the carrier 15, and the lateral length of the tray 17 is approximately ¼ of the longitudinal length of the carrier 15. Thus, four trays 17 arranged along the longitudinal direction of the carrier 15 can cover nearly the entire top surface of the carrier 15, which means that the top surface of the carrier 15 is hardly exposed. When the first handler 11 passes the carrier 15 in this state to the sputtering device 6, the sputtering material hardly adheres to the top surface of the carrier 15 in the sputtering treatment performed by the sputtering device 6. In this way, dirt adhering to the top surface of the carrier 15 in the sputtering treatment can be restrained, which makes it possible to lengthen the time interval for cleaning the carrier 15.

It is assumed that the sputtering treatment is performed on a plurality of trays 17 as a lot. However, there may be a case where the top surface of the carrier 15 is partially covered with the tray(s) 17, depending on the number of remaining trays 17. This leads to the increase in the dirt on the carrier 15. To prevent this situation, a dummy tray 18 having the same shape and size as the tray 17 is previously prepared. When the unshielded tray 17 can be arranged only on a part of the top surface of the carrier 15, it is desirable to place the dummy trays 18 in empty regions. This makes it possible to equalize the level of dirt on the carrier 15, regardless of the number of trays 17 to go through the sputtering treatment.

Note that the shape and size of the tray 17 may be arbitrarily set. It is desirable to optimize the shape and size of the tray 17 in conformity with the shape and size of the carrier 15, to arrange the trays 17 so as not to expose the top surface of the carrier 15 as much as possible. Therefore, the number of trays 17 to be placed on the top surface of the carrier 15 also may be arbitrarily set. It is desirable to place an optimum number of trays 17 on the carrier 15 considering the shape and size of the carrier 15 and the shape and size of each tray 17, so as not to expose the top surface of the carrier 15 as much as possible.

Further, there is no particular limitation on the number of IC packages which can be mounted on one tray 17. The number of IC packages should be arbitrarily set considering the shape and size of the tray 17 and the shape and size of each IC package.

Figure 2:
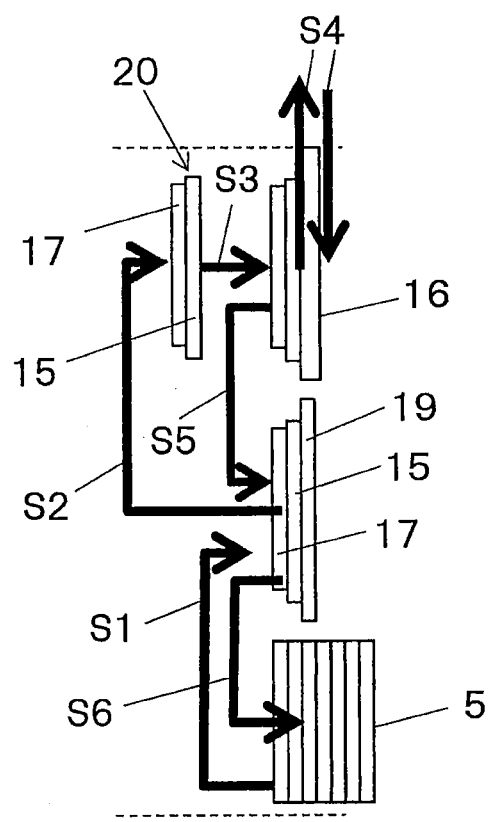
FIG. 2 is a diagram explaining the conveyance operation performed by the semiconductor manufacturing device 1 of FIG. 1.
Figure 3:
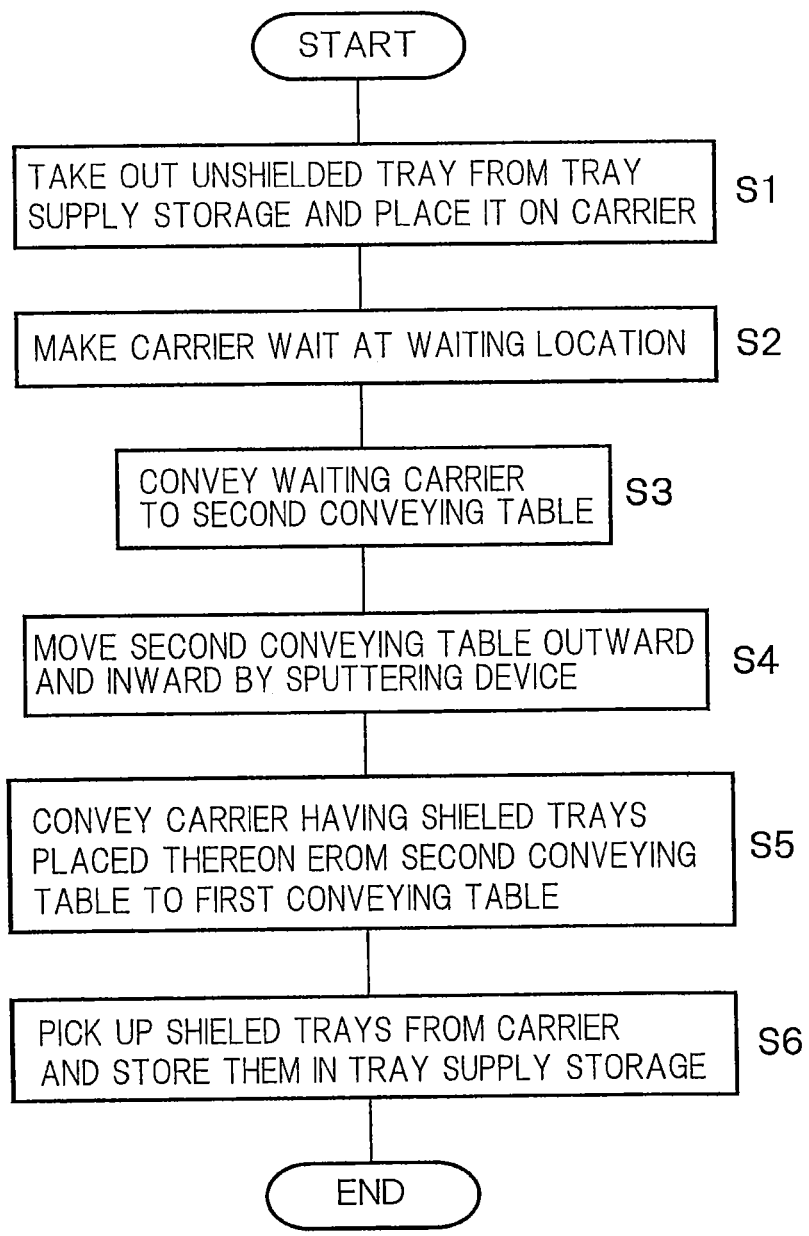
FIG. 3 is a process flow diagram corresponding to FIG. 2.

FIG. 2 is a diagram explaining the conveyance operation performed by the semiconductor manufacturing device 1 of FIG. 1, when FIG. 1 is viewed from a lateral side. Further, FIG. 3 is a process flow diagram corresponding to FIG. 2. First, the second handler 12 takes out the tray 17 having unshielded IC packages mounted thereon from the tray supply storage 5, and places it on the carrier 15 (Step S1). The second handler 12 grasps both of the longitudinal ends of the tray 17 with tray conveying arms (not shown), and places the tray 17 on the carrier 15. As stated above, since four trays 17 can be placed on the carrier 15 for example, Step S1 is repeated four times. Note that the carrier 15 is previously placed on the first conveying table 19 before starting Step S1.

The second handler 12 places the dummy tray 18 on the carrier 15 as needed. When the dummy tray 18 is placed at a location different from the tray supply storage 5, the second handler 12 moves the tray conveying arms in the two-dimensional direction, to place a desired tray 17 or dummy tray 18 on the carrier 15.

Next, the second handler 12 moves the first conveying table 19 from near the tray supply storage 5 toward the sputtering device 6 by a predetermined distance. Thus, the carrier 15 having the tray 17 thereon with unshielded IC packages being mounted on the tray 17 is conveyed together with the first conveying table 19 by a predetermined distance. The second handler 12 moves the first conveying table 19 utilizing the driving force of a servo motor, for example. How to drive the first conveying table 19 and a second conveying table 16 is not particularly questioned.

Next, the first handler 11 lifts the carrier 15, and makes the carrier 15 wait at a predetermined waiting location 20 until it can be stored in the sputtering device 6 (Step S2). The first handler 11 grasps both of the lateral ends of the carrier 15 with carrier conveying arms (not shown), and lifts the carrier 15 to the waiting location 20. The reason why the carrier 15 is made to wait at the waiting location 20 is that the carrier 15 cannot be conveyed into the sputtering device 6 until the sputtering treatment for the carrier 15 previously conveyed into the sputtering device 6 is completed. Therefore, when the sputtering device 6 is not performing the sputtering treatment, the above Step S2 can be omitted.

When a shielded carrier 15 is carried out from the sputtering device 6 and another carrier 15 is ready to be stored in the sputtering device 6, the first handler 11 conveys the carrier 15 waiting at the waiting location 20 to the second conveying table 16 for the sputtering device 6 (Step S3). Also in this case, the first handler 11 grasps both of the lateral ends of the carrier 15 with the carrier conveying arms, and places the carrier 15 on the second conveying table 16. The second conveying table 16 is included in the sputtering device 6, and the carrier 15 placed on the second conveying table 16 is carried into a sputtering vacuum chamber of the sputtering device 6 (Step S4). More specifically, after placing the carrier 15 on the second conveying table 16 with the carrier conveying arms, the first handler 11 transmits, to the sputtering device 6, a signal informing that the carrier 15 has been placed on the second conveying table 16. Upon receiving this signal, the sputtering device 6 draws the second conveying table 16 into the sputtering vacuum chamber to start the sputtering treatment.

When the sputtering treatment is completed, the second conveying table 16 is carried out from the sputtering vacuum chamber (Step S4), and the first handler 11 grasps the carrier 15 with the carrier conveying arms to convey it from the second conveying table 16 to the first conveying table 19 (Step S5). More specifically, when the second conveying table 16 is carried out from the sputtering device 6, the sputtering device 6 transmits a signal for informing about the carry-out. Upon receiving this signal, the first handler 11 grasps the carrier 15 with the carriers conveying arms and places it on the first conveying table 19.

Note that the carrier conveying arms which lift the carrier 15 having the unshielded trays 17 placed thereon from the first conveying table 19 and take it down to the second conveying table 16 through the waiting location 20 are provided separately from the carrier conveying arms which convey the carrier 15 having the shielded trays 17 placed thereon from the second conveying table 16 to the first conveying table 19. Thus, the carrier 15 having the shielded trays 17 placed thereon can be conveyed from the second conveying table 16 to the first conveying table 19 while another carrier 15 is waiting at the waiting location 20, which improves work efficiency.

After that, the second handler 12 moves the first conveying table 19 toward the tray supply storage 5 by a predetermined distance. Thus, the carrier 15 storing the electromagnetically shielded trays 17 moves together with the first conveying table 19 by a predetermined distance.

Next, the second handler 12 sequentially lifts the trays 17 each being placed on the carrier 15 on the first conveying table 19 with the tray conveying arms, and stores the trays 17 in the tray supply storage 5 (Step S6). This Step S6 is repeated until all of the trays 17 on the carrier 15 are stored in the tray supply storage 5.

In order to improve throughput, the sputtering treatment is repeatedly performed. For example, e.g. three carriers 15 are stored in the sputtering device 6 so that the carriers 15 which went through the sputtering treatment are taken out from the sputtering device 6 one by one while storing new carriers 15 in the sputtering device 6 one by one. More specifically, at the same time, the carrier 15 is placed at the waiting location 20 of the first handler 11 with another carrier 15 being placed on the first conveying table 19. This makes it possible to continuously perform electromagnetic shielding on the IC packages mounted on each tray 17 on the carrier 15 through an assembly-line operation.

FIG. 4 is a diagram showing the positional relationship between an upper cover (first upper cover) 22 and tray conveying arms (first arms) 21 for grasping the tray 17. The tray conveying arms 21 are provided to the second handler 12. Each tray conveying arm 21 is provided to a tray conveying arm base (first support) 24 through a first joint 23. The tray conveying arms 21 grasp the longitudinal ends of the tray 17 at two points on each side, for example. Thus, totally four tray conveying arms 21 are provided for example.

The tray conveying arm base 24 is supported in a movable manner by a first shaft member 25 extending upward and downward nearly at the center of the tray conveying arm base 24. An upper cover 22 is provided below the bottom surface of the tray conveying arm base 24.

A plurality of protrusions 26 are provided on the top surface of the upper cover 22. The protrusions 26 are attached so as to be movable upward and downward with respect to the tray conveying arm base 24. A displacement sensor 27 is attached to or around each of the protrusions 26. The displacement sensor 27, which is e.g. a linear gauge sensor, detects the displacement in the upper/lower direction of the upper cover 22. The detection system of the displacement sensor 27 is not particularly questioned as long as it can detect that the upper cover 22 is raised by IC packages 30 in the tray 17 brought into contact with the upper cover 22. There is no particular limitation on the number of displacement sensors 27. For example, when the protrusions 26 are arranged at four corners of the upper cover 22 and at the center of the upper cover 22, it is desirable to provide the displacement sensors 27 corresponding to the positions of the respective protrusions 26.

The second handler 12 grasps both of the longitudinal ends of the unshielded tray 17 with the tray conveying arms 21 when taking the unshielded tray 17 out from the tray supply storage 5. The height of the upper cover 22 is previously adjusted so that the upper cover 22 is arranged above the top surfaces of the IC packages 30 correctly stored in the tray 17 with a predetermined distance therebetween when the tray conveying arms 21 are grasping both of the longitudinal ends of the tray 17.

Here, as shown in FIG. 5, when at least one of the IC packages 30 stored in the tray 17 rides over a wall 28 adjacent to a recess of the tray 17, the top surface of the IC package 30 rises to be brought into contact with the upper cover 22, thereby the upper cover 22 being raised at least partially. In this case, the displacement sensor 27 near the raised part detects the rise of the upper cover 22. When at least one displacement sensor 27 detects the rise of the upper cover 22, the controller 14 instructs the second handler 12 to stop conveying the tray 17.

Upon receiving this instruction, the second handler 12 upwardly retracts the tray conveying arm base 24, tray conveying arms 21, and upper cover 22 along the first shaft member 25, to inspect the storage position of each of the IC packages 30 in the tray 17. This inspection is visual inspection performed by an operator, for example. Instead, the IC package 30 which has an abnormality (i.e., the IC package 30 which is not stored in the correct position) may be automatically detected by comparing a shot image of the outer appearance of the tray 17 with a normal shot image using the technique of pattern matching.

The IC package 30 manually or automatically judged not to be stored in the correct position is correctly stored manually by the operator or automatically by using other arms etc.

Figure 6:
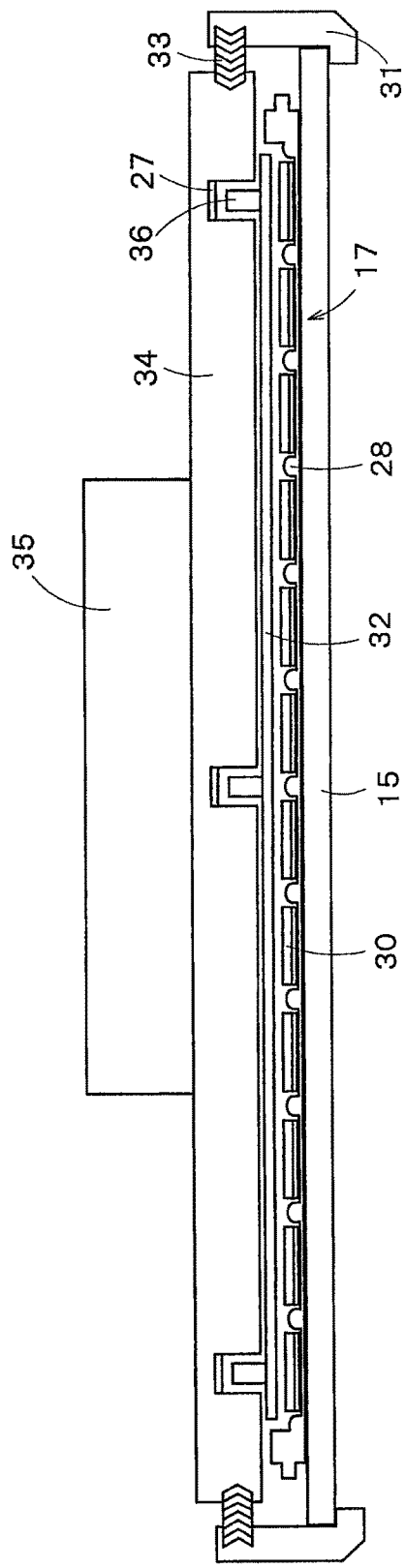
FIG. 6 is a diagram showing the positional relationship between an upper cover 32 and carrier conveying arms 31 for grasping a carrier 15.

FIG. 6 is a diagram showing the positional relationship between an upper cover (second upper cover) 32 and carrier conveying arms (second arms) 31 for grasping the carrier 15. The carrier conveying arms 31 is provided to the first handler 11. Each carrier conveying arm 31 is provided to a carrier conveying arm base (second support) 34 through a second joint 33. The carrier conveying arms 31 grasp the lateral ends of the carrier 15 at two points on each side, for example. Thus, totally four carrier conveying arms 31 are provided for example.

The carrier conveying arm base 34 is supported in a movable manner by a second shaft member 35 extending upward and downward nearly at the center of the carrier conveying arm base 34. An upper cover 32 is provided below the bottom surface of the carrier conveying arm base 34. The positional relationship between the upper cover 32 and tray 17 and the functions of the displacement sensors 27 attached near the upper cover 32 are similar to those of FIG. 4.

When the displacement sensor 27 detects the rise of the upper cover 32 while the carrier conveying arms 31 are conveying the carrier 15, the controller 14 instructs the first handler 11 to stop conveying the carrier 15. In this case, the IC package 30 having an abnormality is detected automatically or through visual inspection by the operator, to store that IC package 30 in the correct position in the tray 17.

The upper cover 22 and displacement sensors 27 are attached to the tray conveying arm base 24 of FIG. 4 to detect an abnormality while the trays 17 are being conveyed. The upper cover 32 and displacement sensors 27 are attached to the carrier conveying arm base 34 of FIG. 6 to detect an abnormality while the carrier 15 is being conveyed.

Figure 7:
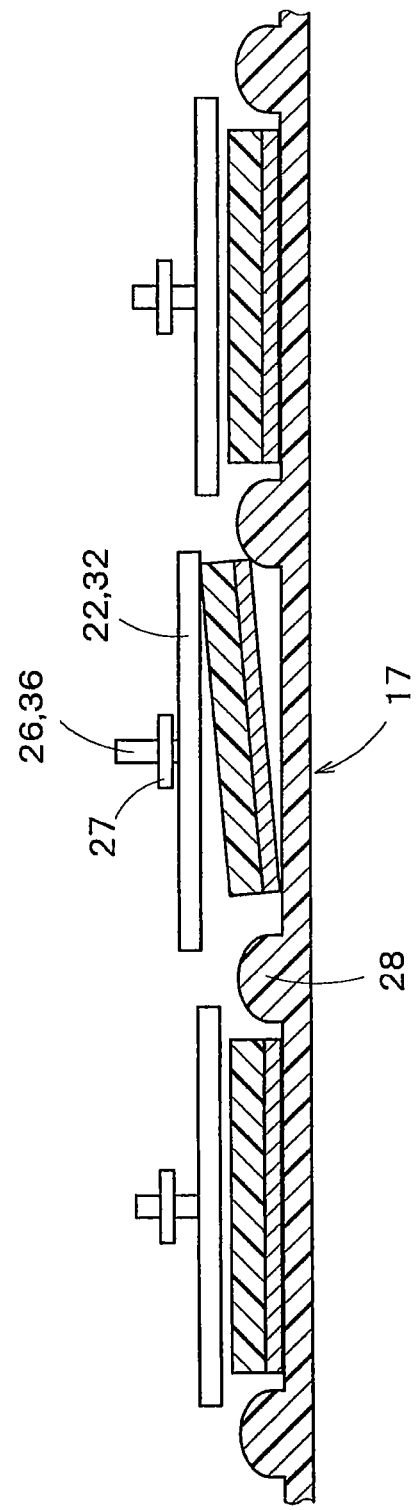
FIG. 7 is a diagram showing an example of dividing the upper cover 22/32.

Each of the upper cover 22 of FIG. 4 and the upper cover 32 of FIG. 6 is arranged to cover a plurality of IC packages 30. There is no particular limitation on the size of the upper cover 22/32. For example, as shown in FIG. 7, the upper cover 22/32 may be divided to cover one or a plurality of IC packages 30 with the divided upper covers 22/32. This makes it easy to identify which IC package 30 has a storage abnormality.

In the example of FIG. 1, after the shielded trays 17 are picked up from the carrier 15 and stored in the tray supply storage 5, the same carrier 15 is continuously used to convey other unshielded trays 17. Since a plurality of trays 17 are placed on the carrier 15, a small amount of sputtering material adheres to the top surface of the carrier 15. However, continuously using the same carrier 15 requires to stop the semiconductor manufacturing device 1 when cleaning the carrier 15. Accordingly, a carrier supply storage (not shown) for storing a plurality of carriers 15 may be provided so that the carrier 15 after picking up the shielded trays 17 is temporarily stored in the carrier supply storage, and that another carrier 15 is taken out from the carrier supply storage, as in the way shown in FIG. 2. Thus, a plurality of carriers 15 stored in the carrier supply storage can be sequentially used, which makes it possible to remarkably lengthen the cleaning interval of each carrier 15. Further, when a plurality of carrier supply storages are provided so that all of the carriers 15 in each carrier supply storage can be removed at one time, all of the carriers 15 in one carrier supply storage can be cleaned at one time while continuously performing the sputtering treatment using another carrier supply storage, which makes it possible to prevent the semiconductor manufacturing device 1 from being stopped in the cleaning operation.

As stated above, in the present embodiment, the upper cover 32 arranged above the tray 17 and the displacement sensors 27 are provided to detect whether the upper cover 32 is raised by the IC packages 30 in the tray 17 brought into contact with the upper cover 32 while the trays 17 and carrier 15 are being conveyed, which makes it possible to store all of the IC packages 30 in the tray 17 at normal storage positions before conveying the tray 17 into the sputtering device. Accordingly, the top and side surfaces of each IC package 30 can be uniformly coated with the sputtering metal while preventing the sputtering metal from adhering to the bottom surface of each IC packages 30, which makes it possible to prevent the trouble of short circuit between pads on the bottom surface and the sputtering metal.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing device comprising:
   an upper cover configured to be arranged above top surfaces of unshielded semiconductor devices which are mounted on a tray placed on a carrier to go through electromagnetic shielding; and
   a displacement detector configured to detect an abnormality when the upper cover is raised, by at least one of the semiconductor devices which are brought into contact with a bottom surface of the upper cover.

2. The semiconductor manufacturing device of claim 1, further comprising:
   a conveyance controller configured to convey the carrier with the upper cover being arranged above the top surfaces of the semiconductor devices, and to stop conveying the carrier when the displacement detector detects an abnormality while the carrier is being conveyed or waiting for being, conveyed.

3. The semiconductor manufacturing device of claim 1, wherein the displacement detector comprises a plurality of displacement sensors provided corresponding to a plurality of parts of the upper cover to detect an abnormality in that each of the parts is raised.

4. The semiconductor manufacturing device of claim 1, wherein the upper cover is arranged above the top surfaces of the semiconductor devices to cover the semiconductor devices at least partially.

5. The semiconductor manufacturing device of claim wherein the upper cover includes a plurality of divided upper covers arranged separately from each other above the top surfaces of one or more predetermined number of the semiconductor devices.

6. The semiconductor manufacturing device of claim wherein the upper cover includes a first upper cover attached to a first support which supports first arms to grasp the tray, and a second upper cover attached to a second support which supports second arms to grasp the carrier.

7. The semiconductor manufacturing device of claim 6, wherein when the tray is grasped by the first arms, the first upper cover is arranged above the top surfaces of the semiconductor devices with a predetermined space therebetween, and
   when the carrier is grasped by the second arms, the second upper cover is arranged above the top surfaces of the semiconductor devices with a predetermined space therebetween.

8. The semiconductor manufacturing device of claim 7, wherein the first upper cover is arranged above the top surfaces of the semiconductor devices with the predetermined space therebetween, both when the first arms take out a tray from a tray supply storage storing trays each having an unshielded semiconductor device mounted thereon to go through electromagnetic shielding, to place the tray on the carrier, and when the first arms pick up a tray having electromagnetically shielded semiconductor device mounted thereon from the carrier, to store the tray in the tray supply storage.

9. The semiconductor manufacturing device of claim 7, wherein the second upper cover is arranged above the top surfaces of the semiconductor devices with the predetermined space therebetween, both when the second arms store, in a sputtering device, a carrier having a tray, placed thereon with an unshielded semiconductor device being mounted on the tray, the sputtering device being provided to coat the semiconductor devices with a sputtering material for electromagnetic shielding, and when the second arms take out, from the sputtering device, a carrier having a tray placed thereon with electromagnetically shielded semiconductor devices being mounted on the tray.

10. The semiconductor manufacturing device of claim 7, further comprising, a first handler configured to drive the first arms and die first upper cover;

a second handler configured to drive the second arms and the second upper cover; and a drive controller configured to control the first handler and the second handler, and stop operation of at least one of the first arms and the second arms when an abnormality in that at least one of the first upper cover and the second upper cover is raised occurs.

11. A semiconductor manufacturing method comprising:

arranging an upper cover above, top surfaces of unshielded semiconductor devices which are mounted on a tray placed on a carrier to go through electromagnetic shielding; and detecting that there is an abnormality when the upper cover is raised by at least one of the semiconductor devices which are brought into contact with a bottom surface of the upper cover.

12. The semiconductor manufacturing method of claim 11, wherein the carrier is conveyed with the upper cover being arranged above the top surfaces of the semiconductor devices, and the conveyance of the carrier is stopped when a displacement detector detects an abnormality while the carrier is being conveyed or waiting for being conveyed.

13. The semiconductor manufacturing method of claim 11, wherein a plurality of displacement detectors are provided corresponding to a plurality of parts of the upper cover to detect an abnormality in that each of the parts is raised.

14. The semiconductor manufacturing method of claim 11, wherein the upper cover is arranged above the top surfaces of the semiconductor devices to cover the semiconductor devices at least partially.

15. The semiconductor manufacturing method of claim 11, wherein the upper cover includes a plurality of divided upper covers arranged separately from each other above the top surfaces of one or more predetermined number of the semiconductor devices.

16. The semiconductor manufacturing method of claim 11, wherein the upper cover includes a first upper cover attached to a first support which supports first arms to grasp the tray, and a second upper cover attached to a second support Which supports second arms to grasp the carrier.

17. The semiconductor manufacturing method of claim 16, wherein when the tray is grasped by the first arms, the first upper cover is arranged above the top surfaces of the semiconductor devices with a predetermined space therebetween, and when the carrier is grasped by the second arms, the second upper cover is arranged above the top surfaces of the semiconductor devices with a predetermined space therebetween.

18. The semiconductor manufacturing method of claim 17, wherein the first upper cover is arranged above the top surfaces of the semiconductor devices with the predetermined space therebetween, both when the first arms take out a tray from a tray supply storage storing trays each having an unshielded semiconductor device mounted thereon to go through electromagnetic shielding, to place the tray on the carrier, and when the first arms pick up a tray having electromagnetically shielded semiconductor devices mounted thereon from the carrier, to store the tray in the tray supply storage.

19. The semiconductor manufacturing method of claim 17, wherein the second upper cover is arranged above the top surfaces of the semiconductor devices with the predetermined space therebetween, both when the second arms store, in a sputtering device, a carrier having a tray placed thereon with an unshielded semiconductor device being mounted on the tray, the sputtering device being provided to coat the semiconductor devices with a sputtering material for electromagnetic shielding, and when the second arms take out, from the sputtering device, a carrier having a tray placed thereon with electromagnetically shielded semiconductor devices being mounted on the tray.

20. The semiconductor manufacturing method of claim 17, wherein an operation of at least one of the first arms and the second arms is stopped when an abnormality in that at least one of the first upper cover and the second upper cover is raised occurs.

* * * * *